United States Patent [19]
Birdsall et al.

[11] Patent Number: 5,410,274
[45] Date of Patent: Apr. 25, 1995

[54] SINGLE-ENDED AND DIFFERENTIAL AMPLIFIERS WITH HIGH FEEDBACK INPUT IMPEDANCE AND LOW DISTORTION

[75] Inventors: Dwight D. Birdsall, Norwalk, Calif.; Phillip L. Elliott, Loveland, Colo.; Lloyd F. Linder, Agora, Calif.; Kelvin T. Tran, Carson, Calif.; Donald G. McMullin, Beverly Hills, Calif.

[73] Assignee: Hughes Aircraft Company, Los Angeles, Calif.

[21] Appl. No.: 210,269

[22] Filed: Mar. 17, 1994

Related U.S. Application Data

[63] Continuation of Ser. No. 945,551, Sep. 16, 1992, abandoned.

[51] Int. Cl.⁶ .............................. H03F 3/26; H03F 3/45
[52] U.S. Cl. ........................................ 330/265; 330/69
[58] Field of Search .................. 330/51, 255, 257, 259, 330/260, 265, 267, 69

[56] References Cited

U.S. PATENT DOCUMENTS

| | | |
|---|---|---|
| 4,502,020 | 2/1985 | Nelson et al. |
| 4,780,689 | 10/1988 | Saller et al. |
| 4,910,477 | 3/1990 | Gross ............................ 330/265 X |
| 4,970,470 | 11/1990 | Gosser . |
| 5,045,803 | 9/1991 | Perroud et al. ...................... 330/51 |
| 5,097,223 | 3/1992 | Alexander ...................... 330/255 X |

Primary Examiner—Steven J. Mottola
Attorney, Agent, or Firm—Georgann S. Grunebach; Terje Gudmestad; W. K. Denson-Low

[57] ABSTRACT

First and second current feedback transconductance amplifiers (102,104) each have a high impedance voltage input, a low impedance current input and a pair of push-pull current outputs. In a single-ended configuration, an input signal is applied to the voltage input of the first transconductance amplifier (102) and the push-pull outputs of the both transconductance amplifiers are connected through a current mirror (136,138) to a node (134) where the current outputs are summed. The node current is integrated by a capacitor (174) to produce a voltage which is amplified by a transimpedance amplifier (190) to produce an output voltage which is fed back to the voltage input of the second transconductance amplifier (104). The current inputs of the transconductance amplifiers (102,104) are interconnected by a resistor (132). The high impedance voltage inputs produce common-mode cancellation of distortion in the transconductance amplifiers (102,104) and low input shot noise. In a differential configuration, differential input signals are applied to the voltage inputs of transconductance amplifiers (260,262), and a separate transimpedance amplifier (292,316) and current mirror (278,280) (302,304) is provided for each transconductance amplifier (260,262). A common-mode feedback circuit (352) controls the common-mode output voltages of the transimpedance amplifiers (292,316) to ground. Switch means (402,404,406,408,410,412) may be added to selectively ground the voltage inputs of the transconductance amplifiers (260,262) and disable their input stages by disconnecting their power supplies (VCC,VEE).

1 Claim, 6 Drawing Sheets

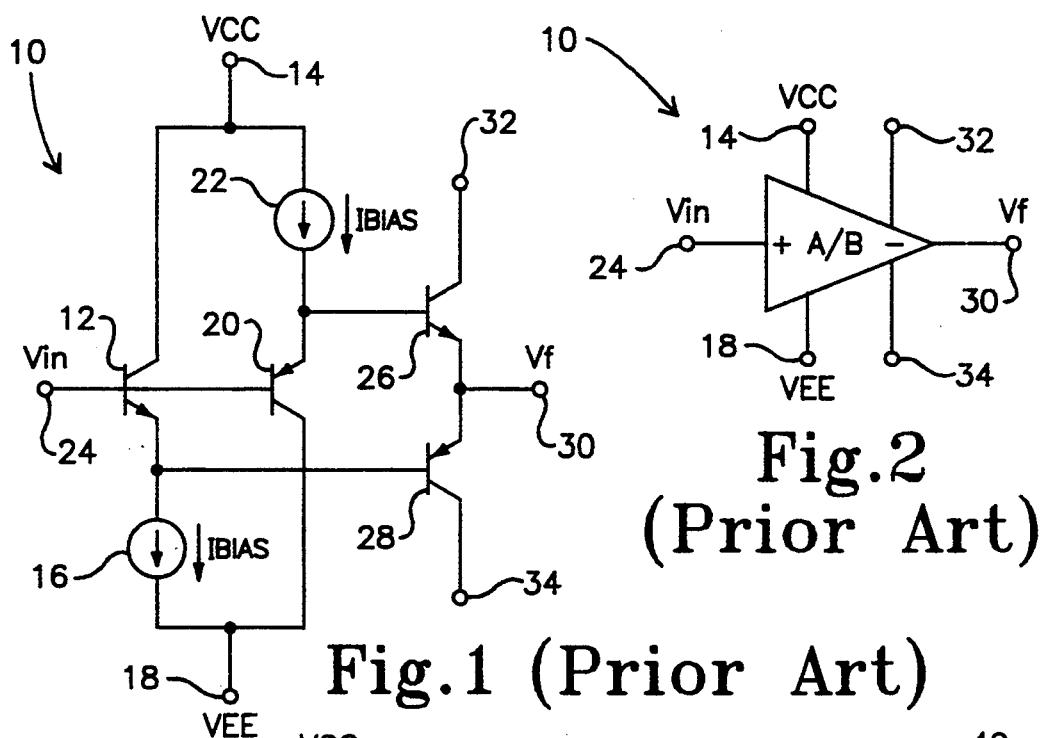
Fig.1 (Prior Art)
Fig.2 (Prior Art)
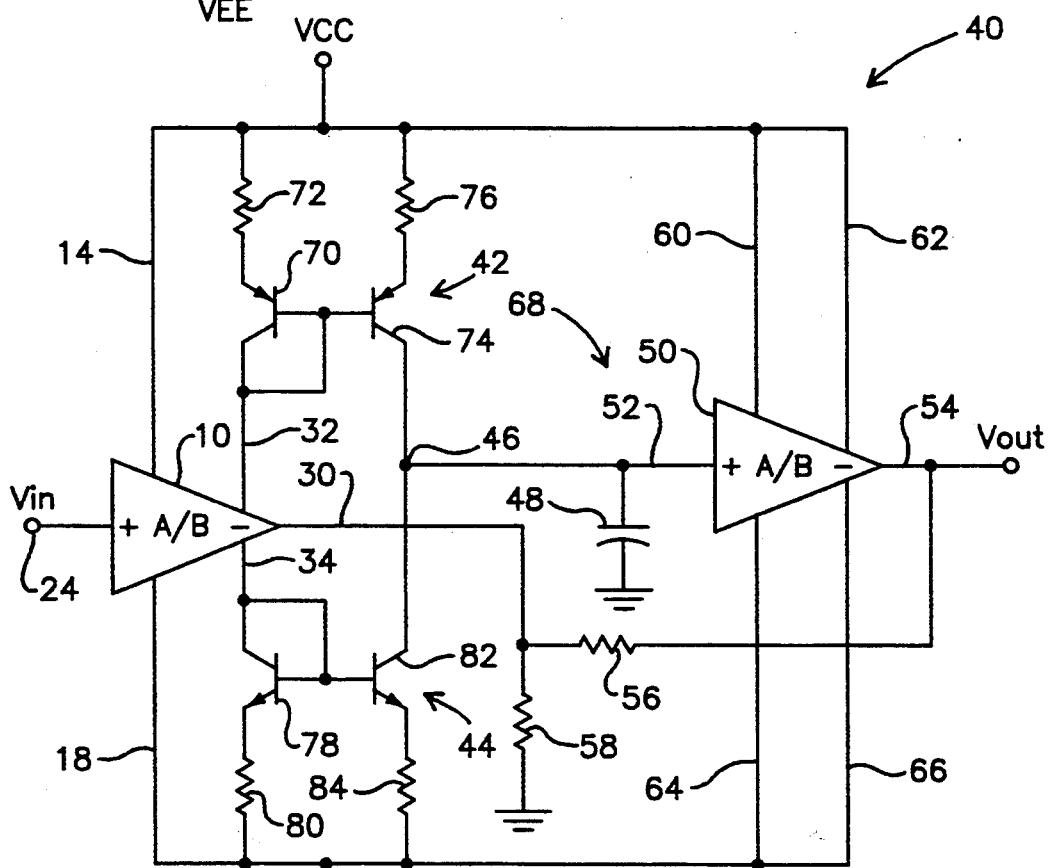
Fig.3 (Prior Art)

SINGLE-ENDED AND DIFFERENTIAL AMPLIFIERS WITH HIGH FEEDBACK INPUT IMPEDANCE AND LOW DISTORTION

This is a continuation of application Ser. No. 945,551, filed Sep. 16, 1992 and now abandoned.

BACKGROUND OF THE INVENTION

1. Field of the Invention

The present invention generally relates to the art of electronic amplification using transistor circuits, and more specifically to single-ended and differential feedback amplifiers which have very low signal distortion and input shot noise.

2. Description of the Related Art

Voltage feedback amplifiers are used in applications in which high linearity and low distortion are the primary requirements. However, voltage feedback amplifiers are inherently slow in operation due to capacitances of circuit nodes and the requirement that the stray capacitances be charged or discharged in order to change the voltages at the nodes.

Current feedback amplifiers are capable of much faster operation than typical voltage feedback amplifiers since the charging current available for charging the various capacitance within the circuit can be significantly greater. A basic current feedback amplifier is disclosed in U.S. Pat. No. 4,502,020, entitled "SETTLING TIME REDUCTION IN WIDE-BAND DIRECT-COUPLED TRANSISTOR AMPLIFIERS" issued Feb. 26, 1985 to D. Nelson et al. An improved current feedback amplifier which provides reduced distortion is disclosed in U.S. Pat. No. 4,970,470, entitled "DC-COUPLED TRANSIMPEDANCE AMPLIFIER" issued Nov. 13, 1990 to R. Gosser.

Other well known advantages of current feedback amplifiers include fast slew rates and fixed bandwidth vs. gain. Two key disadvantages of current feedback amplifiers are related to their low impedance feedback input node with its intrinsic linearity limits and excessive shot current noise.

A current feedback amplifier of the type disclosed by Nelson and Gosser includes a class AB push-pull input stage in the form of a transconductance amplifier 10 as illustrated in FIG. 1. The amplifier 10 is known in the art as an "A/B cell" and may be designated by the symbol illustrated in FIG. 2. The amplifier 10 per se is disclosed in U.S. Pat. No. 4,780,689, entitled "AMPLIFIER INPUT CIRCUIT", issued Oct. 25, 1988 to K. Saller et al.

The amplifier 10 comprises an NPN bipolar transistor 12 having a collector connected to a positive power supply VCC through a terminal 14 and an emitter connected through a constant current source 16 to a negative power supply VEE through a terminal 18. A PNP bipolar transistor 20 has a collector connected to the power supply terminal 18 and an emitter connected through a constant current source 22 to the terminal 14. An input voltage Vin is applied through a voltage input terminal 24 to the bases of the transistors 12 and 20.

An NPN transistor 26 has a base connected to the emitter of the transistor 20 and an emitter connected to the emitter of a PNP transistor 28. The base of the transistor 28 is connected to the emitter of the transistor 12. The emitters of the transistors 26 and 28 are connected to a current feedback input terminal 30. The collectors of the transistors 26 and 28 are connected to push-pull current output terminals 32 and 34 respectively.

The current sources 16 and 22 cause constant bias currents IBIAS to flow therethrough which set up suitable quiescent bias currents through the transistors 12, 20, 26 and 28. As the input signal Vin changes, the voltages at the emitters of the transistors 12, 16, 26 and 28 follow. More specifically, the voltages at the emitters of the transistors 12 and 16 are one forward-biased diode drop Vbe below and above Vin respectively, and a voltage Vf at the terminal 30 is substantially equal to Vin.

Although the terminal 30 is ostensibly a push-pull voltage output terminal, it functions in the amplifier 10 as a current feedback input terminal, and will be referred to as such since it receives a current feedback input from a source external to the amplifier 10. Since the emitters of the transistors 26 and 28 are connected to the terminal 30, the impedance presented by the terminal 30 to an external signal is low, and current can flow into or out of the terminal 30.

FIG. 3 illustrates a complete current feedback amplifier 40 which is a simplified version of the amplifier disclosed in the Nelson and Gosser patents and includes the transconductance amplifier 10. The current output terminals 32 and 34 are connected through current mirrors 42 and 44 to a node 46. The current mirrors 42 and 44 mirror the currents flowing through the terminals 32 and 34 to the node 46, which has a very high impedance.

An amplifier 50, which is identical to the amplifier 10, serves as a buffer amplifier between the high impedance node 46 and an output terminal 54. A voltage input terminal 52 of the amplifier 50 is connected to the node 46, and the output terminal 54 is connected to the current feedback input terminal 30. Resistors 56 and 58 form a resistive current divider and serve as the current feedback network between the amplifier output 54 and the current feedback input terminal 30.

The amplifier 50 further has terminals 60 and 62 which correspond to the terminals 14 and 32 respectively of the amplifier 10 and are connected to the VCC supply, and terminals 64 and 66 which correspond to the terminals 18 and 34 respectively of the amplifier 10 and are connected to the VEE supply. A capacitor 48 is connected between the node 46 and signal ground and serves as amplifier loop compensation. The amplifier 50 produces an output voltage Vout at the terminal 54.

The amplifier 50 further has terminals 60 and 62 which correspond to the terminals 14 and 32 of the amplifier 10 respectively and are connected to the VCC supply, and terminals 64 and 66 which correspond to the terminals 18 and 34 of the amplifier 10 respectively and are connected to the VEE supply. The amplifier 50 produces an output voltage Vout at the terminal 54. The node 46, capacitor 48 and amplifier 50 constitute a transimpedance amplifier 68.

The current mirror 42 includes a diode-connected PNP transistor 70 and a resistor 72 which are connected in series between the terminal 32 and supply VCC, and a PNP transistor 74 which has a base connected to the base of the transistor 70. The collector of the transistor 74 is connected to the node 46, whereas the emitter of the transistor 74 is connected through a resistor 76 to the supply VCC.

The current mirror 44 includes a diode-connected NPN transistor 78 and a resistor 80 which are connected in series between the terminal 34 and supply VEE, and an NPN transistor 82 which has a base connected to the base of the transistor 78. The collector of the transistor 82 is connected to the node 46, whereas the emitter of the transistor 82 is connected through a resistor 84 to the supply VEE.

Under static conditions, the output voltage Vout has a value which is equal to Vin×(1+R56+R58). The resistors 56 and 58 constitute a current divider which causes a fraction of the output current from Vout to appear at the terminal 30. Due to the action of the feedback loop, the voltage at the terminal 30, under static conditions, is equal to Vin.

If the input voltage Vin at the input terminal 24 increases above the voltage at the feedback terminal 30, current will flow out of the feedback terminal 30, with the current through the terminal 32 increasing and the current through the terminal 34 decreasing. These currents are mirrored by the current mirrors 42 and 44 to the node 46, and causes current to flow out of the node 46 and charge the capacitor 48. The voltage across the capacitor 48 increases and causes the output voltage Vout to increase until the voltage at the feedback terminal 30 increases to the new value of Vin. The operation is opposite for a decrease in the input voltage Vin.

The effective width of the base region in a bipolar transistor varies as a non-linear function of the collector-emitter voltage Vce. This causes modulation of the current gain $\beta$ of the transistor which in turn causes a change in the base and collector currents of the transistor even though the emitter current remains constant. This is known as "base-width" or "Early effect" modulation.

As is evident from viewing FIG. 1, the transistors 12 and 20, and the bases of the transistors 26 and 28 are outside the feedback loop which leads from the output terminal 54 of the amplifier 50 to the current feedback terminal 30 of the amplifier 10. The transistors 12, 20, 26 and 28 are therefore subject to base-width modulation and generate distortion which appears in the output signal Vout. Any parametric asymmetry between these transistors exacerbates the distortion. The lack of feedback to the front end of the amplifier 10 also limits the linearity of the current feedback amplifier configuration.

In addition, current noise generated in the transistors 26 and 28 is summed directly into the feedback signal path terminal 30 and thus leads to excessive amplifier output noise. These drawbacks have prevented current feedback amplifiers from being used in applications in which low distortion and noise are required in addition to high slew rate and high frequency response.

SUMMARY OF THE INVENTION

In an amplifier embodying the present invention, first and second current feedback transconductance amplifiers each have a high impedance voltage input, a low impedance current feedback input and a pair of push-pull current outputs.

In a single-ended configuration, an input signal is applied to the voltage input of the first transconductance amplifier, and the push-pull outputs of the both transconductance amplifiers are connected through a current mirror to a node such that the current outputs are summed. The node current is integrated by a capacitor to produce a voltage which is amplified by a transimpedance amplifier to produce an output voltage which is fed back to the voltage input of the second transconductance amplifier.

The current feedback inputs of the transconductance amplifiers are interconnected by a resistor. The voltage and current errors (distortion) of the first transconductance amplifier are identical to those of the second transconductance amplifier. The second transconductance amplifier is positioned within a voltage feedback loop such that its voltage errors cancel the first transconductance amplifier's voltage errors.

The current outputs of the transconductance amplifiers are summed in such a manner that the current errors are equal and summed on opposite sides of a current mirror thus canceling each other. The high impedance voltage inputs produce common-mode cancellation of distortion in the transconductance amplifiers and low input shot noise.

In a differential configuration, differential input signals are applied to the voltage inputs of the transconductance amplifiers, and a separate transimpedance amplifier and current mirror is provided for each transconductance amplifier. A common-mode feedback circuit controls the common-mode differential output voltages of the transimpedance amplifier about ground. A switching arrangement may be added to selectively ground the voltage inputs of the transconductance amplifiers and disconnect them from their power supplies and "hold" the stored value at the integrating compensation capacitors.

The present invention eliminates the drawbacks of conventional voltage and current feedback amplifiers, while retaining the advantages of both. The base width (Early effect) modulation and other distortions generated in the transconductance amplifiers are eliminated by common-mode rejection, since the distortions appear at the voltage inputs of both amplifiers. The high shot noise of the conventional current feedback amplifier is reduced to a negligible level by applying the feedback to a high impedance input.

This enables an amplifier embodying the present invention, whether in single-ended or differential form, to operate with the high linearity and low distortion and noise of a voltage feedback amplifier, and the high speed and slew rate of a current feedback amplifier.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is an electrical schematic diagram illustrating a prior art current feedback transconductance amplifier;

FIG. 2 illustrates a schematic symbol for the amplifier of FIG. 1;

FIG. 3 is an electrical schematic diagram illustrating a prior art current feedback amplifier including the transconductance amplifier of FIG. 1;

DETAILED DESCRIPTION OF THE INVENTION

Figure 4:
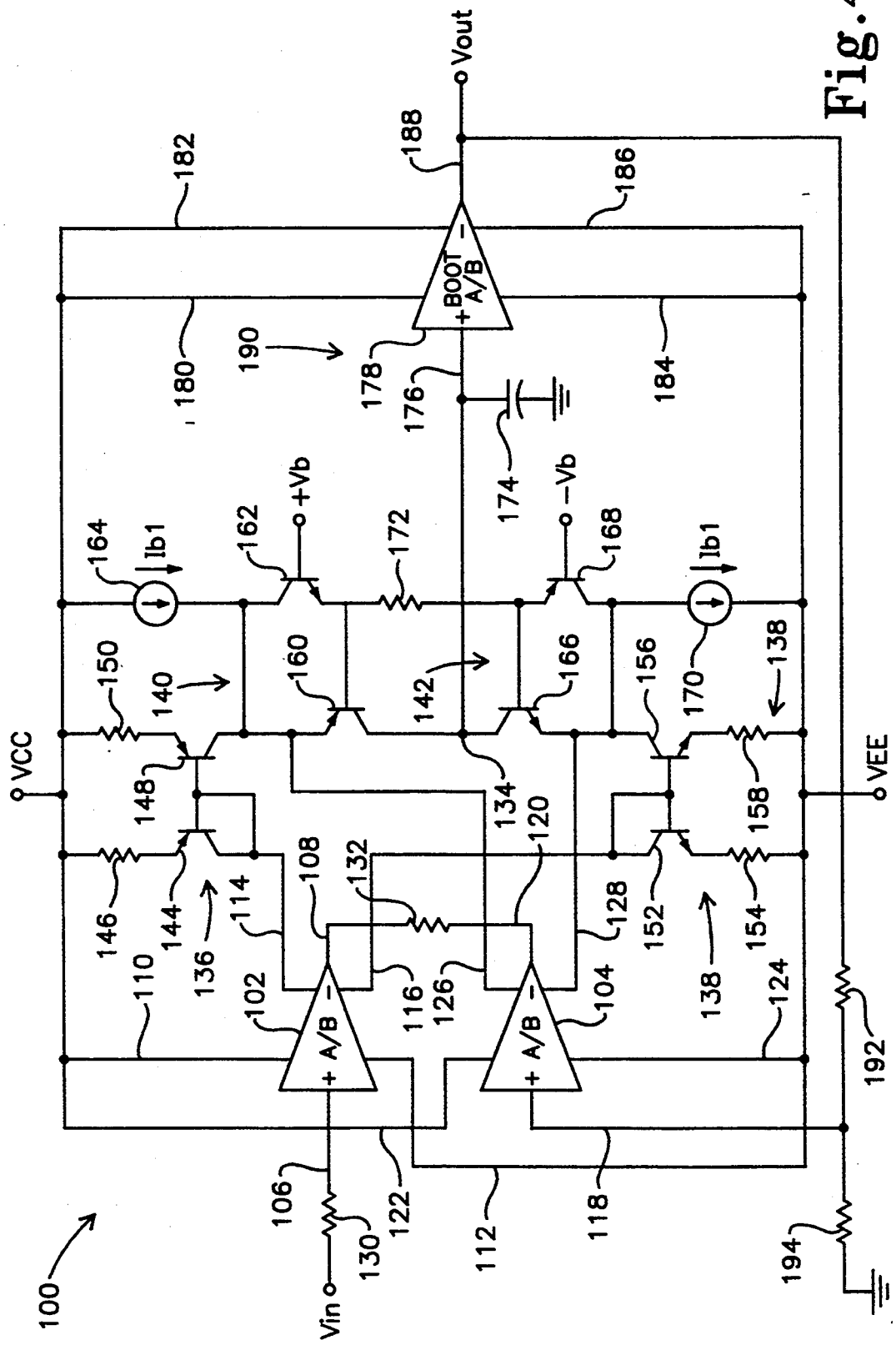
FIG. 4 is an electrical schematic diagram illustrating a single-ended amplifier embodying the present invention.

A single-ended amplifier 100 embodying the present invention is illustrated in FIG. 4, and includes two transconductance amplifiers 102 and 104 which may be identical to the amplifier 10 of FIG. 1.

The amplifier 102 has a voltage input terminal 106, a current feedback input terminal 108, power supply terminals 110 and 112 which are connected to the supplies VCC and VEE respectively, and push-pull current output terminals 114 and 116.

The amplifier 104 has a voltage input terminal 118, a current feedback input terminal 120, power supply terminals 122 and 124 which are connected to the supplies VCC and VEE respectively, and push-pull current output terminals 126 and 128.

An input signal Vin is applied to the voltage input terminal 106 of the amplifier 102 through an input resistor 130. The current feedback input terminals of the amplifiers 102 and 104 are interconnected by a resistor 132. The currents through the terminals 114 and 116 are mirrored to a high impedance node 134 by current mirrors 136 and 138 and cascode stages 140 and 142 respectively.

The current mirror 136 includes a diode-connected PNP transistor 144 and a resistor 146 which are connected in series between the terminal 114 and the supply VCC, and a PNP transistor 148 which has a base connected to the base of the transistor 144. The collector of the transistor 148 is connected to the cascode stage 140, whereas the emitter of the transistor 148 is connected through a resistor 150 to the supply VCC.

The current mirror 138 includes a diode-connected NPN transistor 152 and a resistor 154 which are connected in series between the terminal 116 and the supply VEE, and an NPN transistor 156 which has a base connected to the base of the transistor 152. The collector of the transistor 156 is connected to the cascode stage 142, whereas the emitter of the transistor 156 is connected through a resistor 158 to the supply VEE.

The cascode stages 140 and 142 provide isolation between the amplifiers 102,104 and 178, a means to sum the output signal currents of the amplifiers 102 and 104 in phase, and increase the impedance of the node 134. The cascode stage 140 includes a PNP transistor 160 having an emitter connected to the collector of the transistor 148 and a collector connected to the node 134. An NPN transistor 162 has a collector connected to the emitter of the transistor 160 and an emitter connected to the base of the transistor 160. A constant current source 164 which sources a constant current Ib1 is connected between the supply VCC and the collector of the transistor 162, whereas a bias voltage +Vb is applied to the base of the transistor 162.

The cascode stage 142 includes an NPN transistor 166 having an emitter connected to the collector of the transistor 156 and a collector connected to the node 134. A PNP transistor 168 has a collector connected to the emitter of the transistor 166 and an emitter connected to the base of the transistor 166. A constant current source 170 which sinks a constant current Ib1 is connected between the supply VEE and the collector of the transistor 168, whereas the bias voltage −Vb is applied to the base of the transistor 168.

A resistor 172 is connected between the emitters of the transistors 162 and 168. The current output terminal 126 of the amplifier 104 is connected to the emitter of the transistor 160, whereas the current output terminal 128 is connected to the emitter of the transistor 166. An integrating compensation capacitor 174 is connected across the node 134 (between the node 134 and ground).

The node 134 is also connected to a voltage input terminal 176 of a bootstrapped transconductance amplifier 178 which will be described in detail below with reference to FIG. 5. The amplifier 178 is similar to the amplifiers 102 and 104 except that it includes additional circuitry which compensates for base width (Early effect) modulation therein.

The amplifier 178 further has power supply and current output terminals 180 and 182 respectively which are connected to the VCC supply, and power supply and current output terminals 184 and 186 respectively which are connected to the VEE supply. The amplifier 178 produces an output voltage Vout at an output terminal 188.

The cascode stages 140 and 142, node 134, capacitor 174 and amplifier 178 constitute a transimpedance amplifier 190. The emitters of the transistors 160 and 166 constitute push-pull current inputs of the amplifier 190.

A feedback resistor 192 is connected between the output terminal 188 of the amplifier 178 and the voltage input terminal 118 and ground thus forming a resistive voltage divider feedback network. A shunt resistor 194 is connected between the terminal 118 and ground.

For a voltage gain greater than unity, the resistance of the resistor 130 is selected to be equal to the resistances of the resistors 192 and 194 in parallel. For unity voltage gain, the shunt resistor 194 is omitted (shunt impedance equal to infinity), and the resistances of the resistors 130 and 192 are selected to be equal. The open loop gain of the amplifier 100 is equal to the impedance of the node 134 divided by one-half the resistance of the resistor 132.

Under static closed-loop conditions, the output voltage Vout has a value which is proportional to Vin ×(1+R192/R194). The resistors 192 and 194 constitute a voltage divider which causes a fraction of the output voltage Vout to appear at the voltage input terminal 118 of the amplifier 104. Due to the action of the feedback loop, the voltage at the terminal 118, under static conditions, is equal to Vin.

If the input voltage Vin at the voltage input terminal 106 of the amplifier 102 increases above the voltage at the voltage input terminal 118 of the amplifier 104, current will flow out of the feedback terminal 108 of the amplifier 102, with the current through the terminal 114 increasing and the current through the terminal 116 decreasing. These currents are mirrored by the current mirrors 136 and 138 and cascode stages 140 and 142 to the node 134, and cause current to flow out of the node 134 and charge the capacitor 174 in a positive direction. The voltage across the capacitor 174 increases and causes the output voltage Vout to increase until the voltage at the input terminal 118 increases to the new value of Vin.

The current flowing out of the feedback input terminal 108 of the amplifier 102 flows through the resistor 132 into the feedback input terminal 120 of the amplifier 104. The current through the output terminal 126 decreases, whereas the current through the output terminal 128 increases. This causes the current flowing through the transistor 160 into the node 134 to increase by the amount the current flowing into the terminal 126 decreases, and causes the current flowing out of the node 134 through the transistor 166 to decrease by the amount the current flowing into the terminal 128 increases.

In this manner, the output signal currents of the amplifiers 102 and 104 are added or constructively summed together at the node 134. Thus, the amplifier 100 provides twice the transconductance output current of the prior art amplifier 40.

The components of the amplifiers 102 and 104 are matched, and produce substantially identical base width (Early effect) and other signal modulation errors. The signal which is fed back from the output terminal 188 of the amplifier 178 to the voltage input terminal 118 of the amplifier 104 includes the input signal Vin and also the modulation errors introduced by the amplifier 102. The amplifier 104 introduces modulation errors which are identical to those in the feedback signal. Thus, these errors are common mode and are canceled since the current feedback terminals of the amplifiers 102 and 104 are interconnected by the resistor 132.

The modulation errors introduced by the amplifiers 102 and 104 need not be dealt with explicitly since they are automatically canceled by common mode rejection. In this manner, the amplifier 100 has the low distortion and high linearity which have been attainable in the past only with voltage feedback amplifiers. However, due to the internal current mode configuration, the present amplifier 100 has the high operating speed and slew rate of a current feedback amplifier. In addition, because the slew current is produced by the differential input voltage, at the terminals 106 and 118, across the transconductance resistor 132, the typical slewing limits found in voltage feedback amplifiers are avoided.

The feedback signal is applied to the voltage input terminal 118 of the amplifier 104, which is a high impedance input. Thus, the feedback current through the resistor 192 and the resulting shot noise are very low. In this manner, the present amplifier 100 also attains the low shot noise operation of a voltage feedback amplifier.

Figure 5:
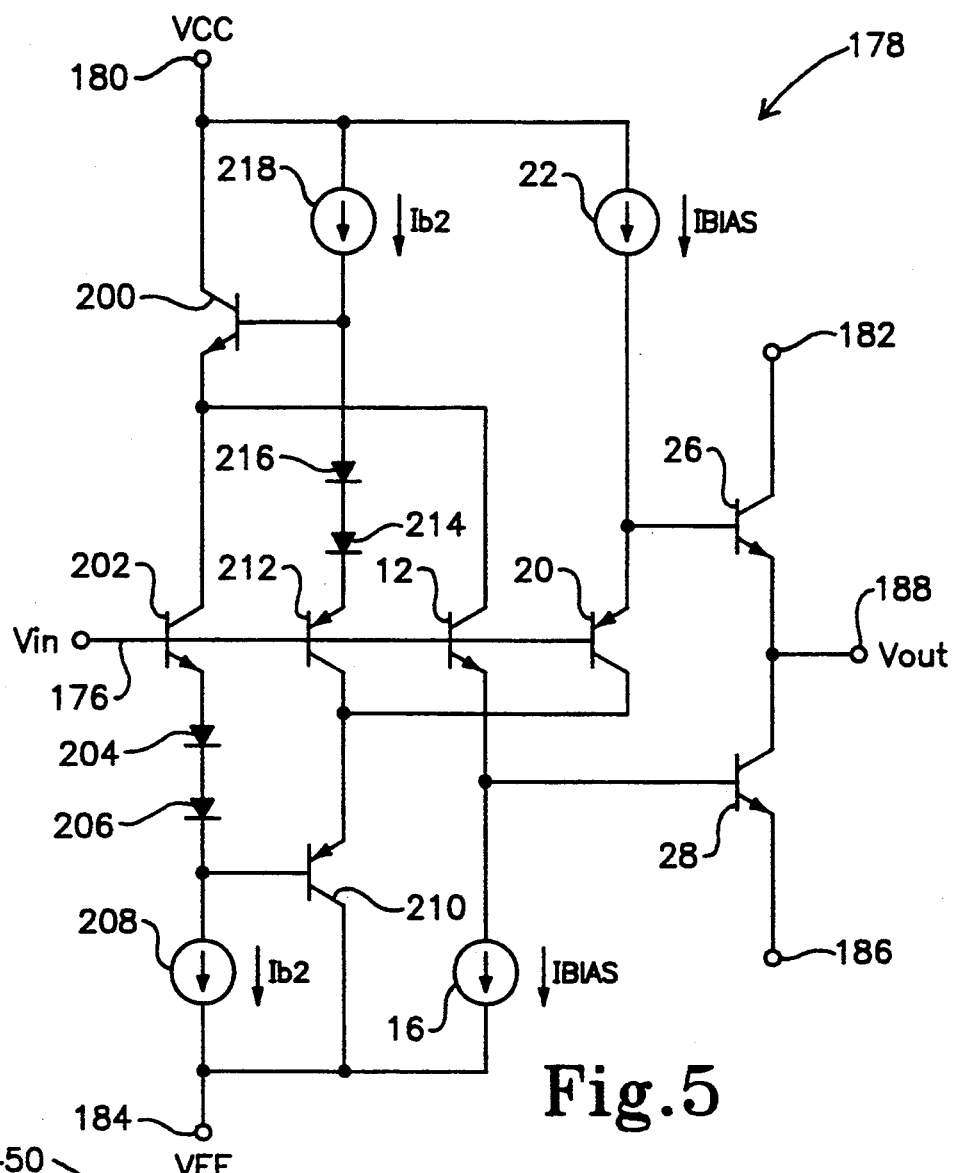
FIG. 5 is an electrical schematic diagram illustrating a bootstrapped transconductance amplifier which constitutes an element of the current feedback amplifier of FIG. 4.

The bootstrapped current feedback transconductance amplifier 178 is illustrated in FIG. 5. For ease of comparison, the elements common to those of the amplifier 10 illustrated in FIG. 1 are designated by the same reference numerals.

The bootstrap circuitry of the amplifier 178 includes an NPN transistor 200 having a collector connected to the terminal 180 and an emitter connected to the collector of an NPN transistor 202. The emitter of the transistor 202 is connected to the terminal 184 through diodes 204, 206 and a constant current source 208 which sinks a current Ib2.

A PNP transistor 210 has a collector connected to the terminal 184 and an emitter connected to the collector of a PNP transistor 212. The emitter of the transistor 212 is connected to the terminal 180 through diodes 214 and 216 and a constant current source 218 which sources a current Ib2.

The input signal Vin is applied to the bases of the transistors 202 and 212. The base of the transistor 200 is connected to the junction of the diode 216 and source 218. The base of the transistor 210 is connected to the junction of the diode 206 and source 208. The collector of the transistor 12 is connected to the emitter of the transistor 200, whereas the collector of the transistor 20 is connected to the emitter of the transistor 210.

The base voltage of the transistor 200 follows the input voltage Vin, but is three forward-biased diode drops Vbe above Vin. This is due to one Vbe drop across the base-emitter junction of the transistor 212 and one Vbe drop across each of the diodes 214 and 216. The emitter voltage of the transistor 200 and thereby the collector voltages of the transistors 202 and 12 are two Vbe drops above Vin due to the Vbe drop across the base-emitter junction of the transistor 200.

The collectors of the transistors 202 and 12 are maintained at a constant voltage offset of +2Vbe from the bases and thereby the emitters thereof. In this manner the collector-emitter voltages Vce of the transistors 202 and 12 do not change, and no base width modulation is produced. In an essentially similar manner, the collectors of the transistors 212 and 20 are maintained two diode drops or −2Vbe below Vin.

It will be understood that the amplifiers 102 and 104 need not be bootstrapped due to the common mode rejection. However, any signal modulation current errors introduced by the amplifier 178 at the node 134 will appear as an error voltage across the resistor 132 which is equivalent to a differential error voltage at the input terminals 106 and 118. These errors would appear in the output signal Vout if the amplifier 178 were not bootstrapped.

Figure 6:
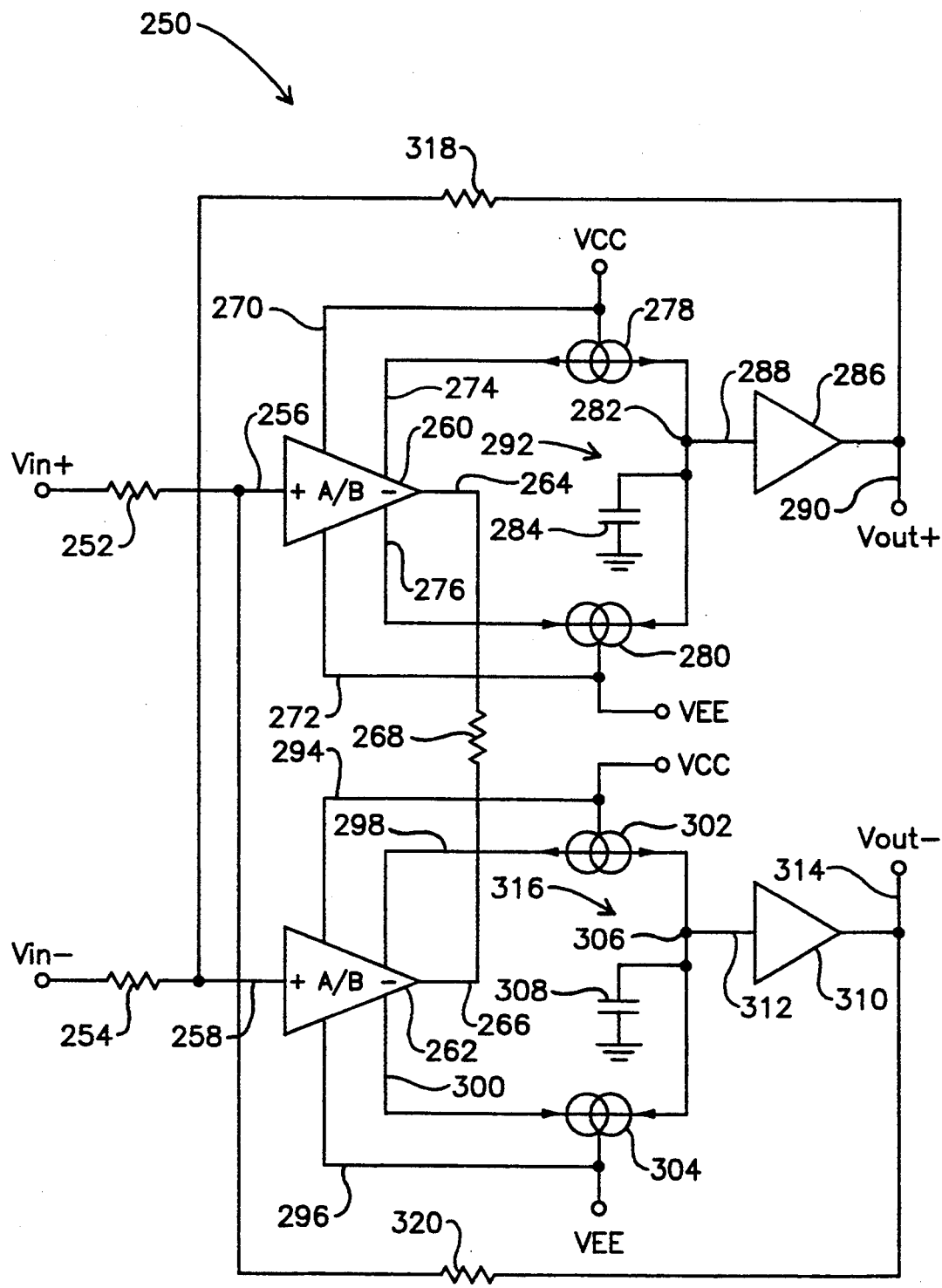
FIG. 6 is an electrical schematic diagram illustrating a differential amplifier embodying the present invention.

FIG. 6 illustrates an amplifier 250 embodying the present invention in a differential configuration. Differential input signals Vin+ and Vin− are applied through input resistors 252 and 254 to high impedance voltage input terminals 256 and 258 of current feedback transconductance amplifiers 260 and 262 respectively. The amplifiers 260 and 262 may be identical to the amplifiers 102 and 104 of FIG. 4. Low impedance current feedback input terminals 264 and 266 of the amplifiers 260 and 262 are interconnected by a resistor 268.

The amplifier 260 has power supply terminals 270 and 272 which are connected to the supplies VCC and VEE respectively, and push-pull current output terminals 274 and 276 which are connected through current mirrors 278 and 280 to a high impedance node 282. An integrating compensation capacitor 284 is connected between the node 282 and signal ground. A transconductance amplifier 286 which may be embodied by the amplifier 178 of FIG. 5 has a voltage input terminal 288 connected to the node 282 and a voltage output terminal 290 which produces an output signal Vout+. The node 282, capacitor 284 and amplifier 286 constitute a transimpedance amplifier 292.

The amplifier 262 has power supply terminals 294 and 296 which are connected to the supplies VCC and VEE respectively, and push-pull current output terminals 298 and 300 which are connected through current mirrors 302 and 304 to a high impedance node 306. An integrating compensation capacitor 308 is connected between the node 306 and signal ground. A transconductance amplifier 310 which is identical to the amplifier 286 has a voltage input terminal 312 connected to the node 306 and a voltage output terminal 314 which produces an output signal Vout−. The node 306, capacitor 308 and amplifier 310 constitute a transimpedance amplifier 316.

Due to the differential configuration, the required negative feedback can be obtained by cross-connection. More specifically, the voltage output terminal 290 of the amplifier 286 is connected through a feedback resistor 318 to the voltage input terminal of the amplifier 262, whereas the voltage output terminal 314 of the amplifier 310 is connected through a feedback resistor 320 to the voltage input terminal 256 of the amplifier 260.

The operation of the amplifier 250 is similar to that of the amplifier 100 except that the differential channels are separate. Cancellation of common mode modulation errors introduced in the amplifiers 260 and 262 is accomplished by the cross-connected feedback loops and the interconnection of the feedback input terminals 264 and 266 by the resistor 268. The amplifier 250 has low shot noise since both voltage input terminals 256 and 258 have high impedance. The amplifier 250 is fully differential, and achieves the advantages of voltage and current feedback amplifiers as described above with reference to the single-ended amplifier 100 of FIG. 4 while eliminating the drawbacks thereof.

Figure 7:
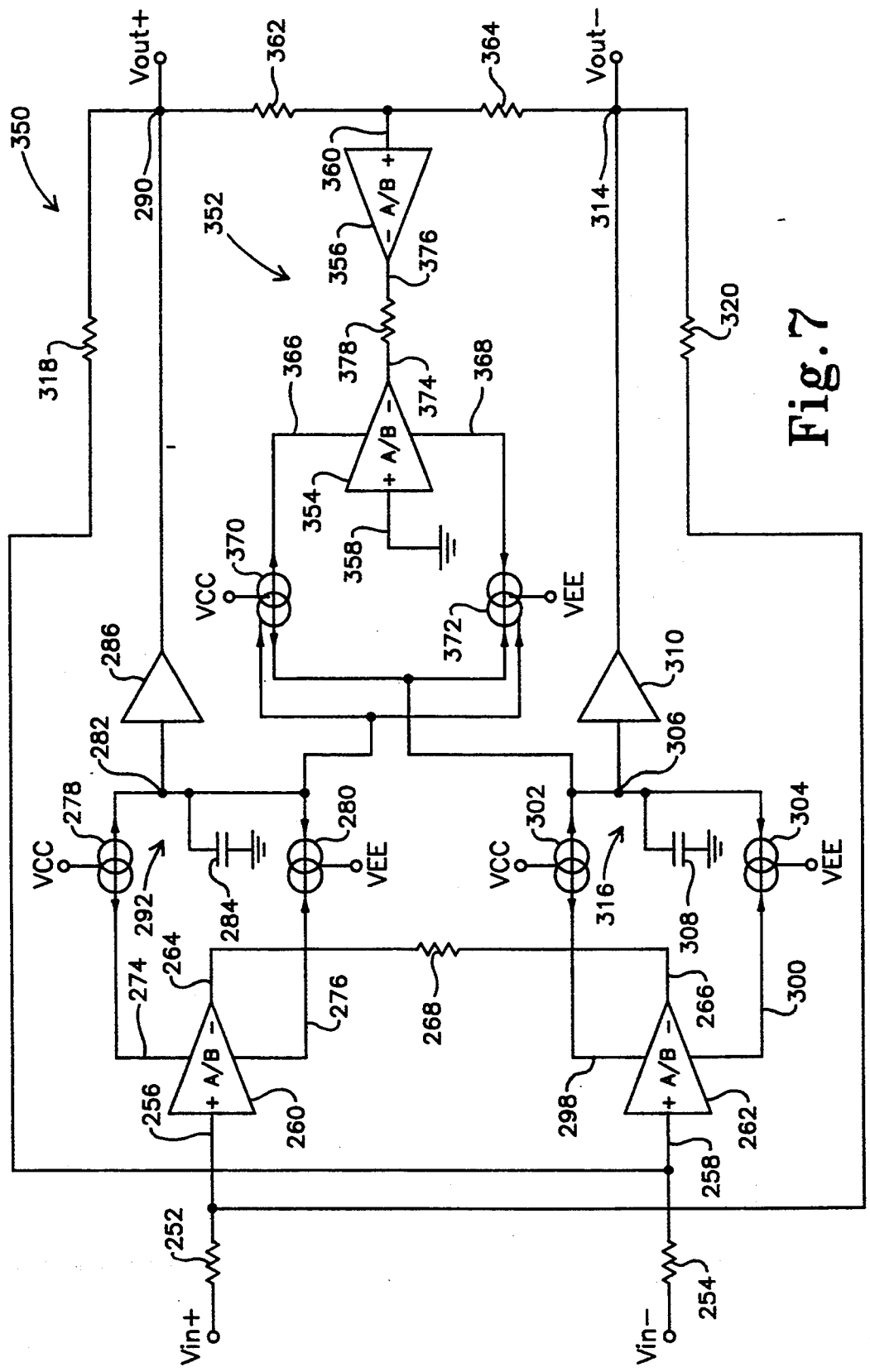
FIG. 7 illustrates the amplifier of FIG. 6 as further including a common-mode feedback arrangement.

The amplifier 250 as illustrated in FIG. 6 is subject to common mode output voltage drift. For example, assuming that the input signals Vin+ and Vin− are equal, the output voltages Vout+ and Vout− could drift together between the supply voltages VCC and VEE and possibly latch up at one of them. This would render the amplifier 250 inoperative. This problem is solved as illustrated in FIG. 7 by adding a common mode feedback loop to the amplifier 250. The resulting amplifier is designated as 350 and includes the elements of the amplifier 250 which are designated by the same reference numerals.

The amplifier 350 includes a common mode feedback circuit 352 including current feedback transconductance amplifiers 354 and 356. The amplifier 354 has a voltage input terminal 358 which is connected to receive a predetermined common mode output reference voltage, in this case ground. The amplifier 356 has a voltage input terminal 360 which is connected to receive a common mode output voltage of the amplifier 350. More specifically, the terminal 360 is connected to the junction of equal resistors 362 and 364 which are connected in series across the output terminals 290 and 314. The voltage which appears at the terminal 360 is the algebraic sum of the output voltages Vout+ and Vout−.

The amplifier 354 has push-pull output terminals 366 and 368 which are connected to input terminals of dual output current mirrors 370 and 372 respectively. The outputs of the current mirrors 370 and 372 are connected to the nodes 282 and 306 such that the mirrors 370 and 372 will sink or source current onto the nodes 282 or 306 in order to move Vout+ and Vout− in a common direction. The amplifiers 354 and 356 have feedback input terminals 374 and 376 respectively which are interconnected by a resistor 378.

The common mode feedback circuit 352 functions to center the output voltages Vout+ and Vout− about the reference voltage, which is in this case ground. Assuming that the voltages Vout+ and Vout− drift positive in common mode, the current into the terminal 366 of the amplifier 354 will decrease and the current out of the terminal 368 will increase. The current mirrors 370 and 372 will source or sink current from the nodes 282 and 306 to make the output voltages Vout+ and Vout− less positive until the summed output voltage at the terminal 360 is equal to that of the terminal 358, which is in this case ground. The operation is opposite for a decrease in the common mode output voltage.

Figure 8:
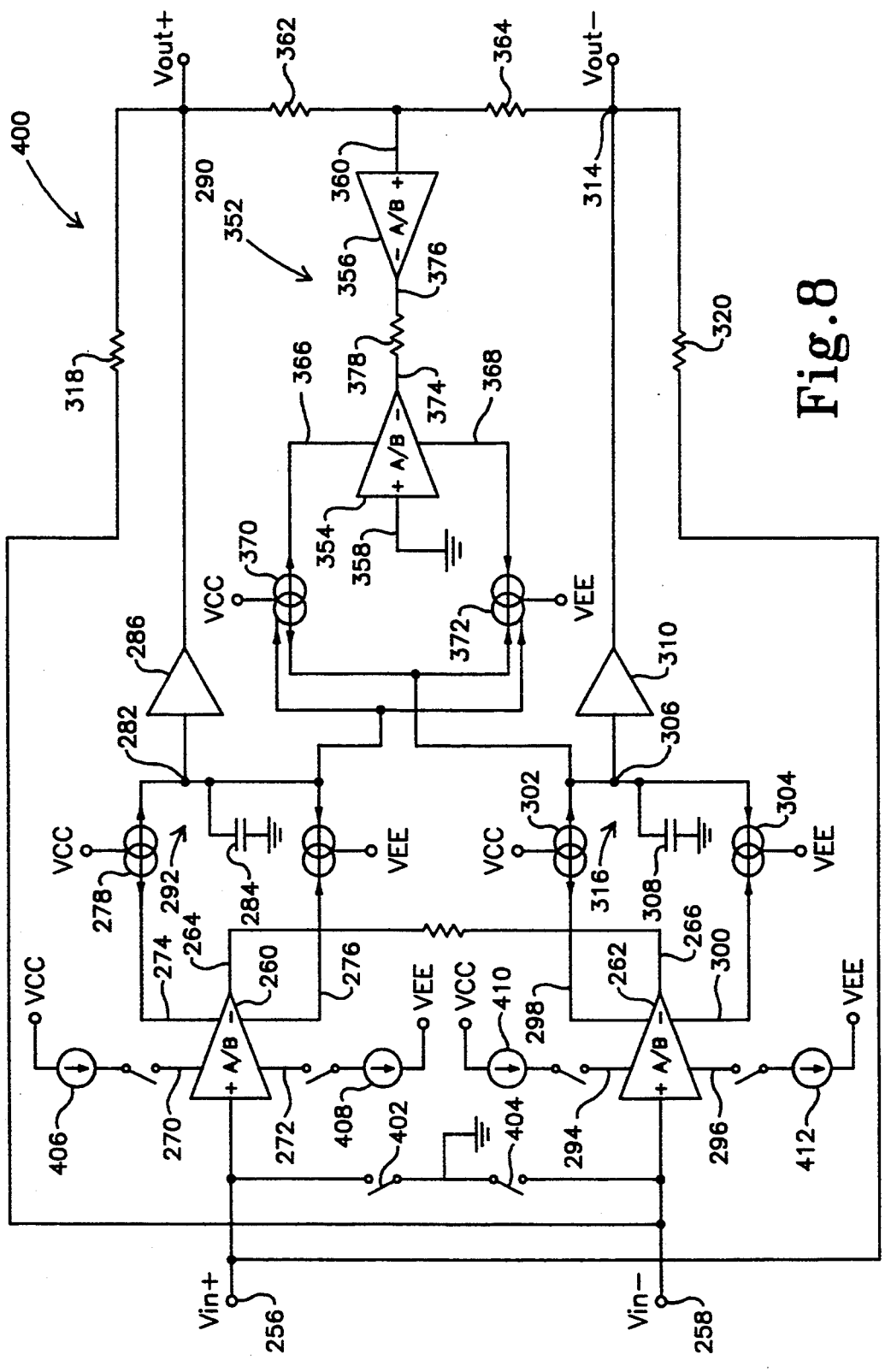
FIG. 8 illustrates the amplifier of FIG. 7 as further including an input switching arrangement.

FIG. 8 illustrates how switches can be added to disable the amplifier 350 into a predetermined state and thus allow it to be utilized as an element of, for example, a subranging analog-to-digital converter (ADC). An amplifier 400 includes switches 402 and 404 which are connected between the voltage input terminals 256 and 258 respectively and ground. Switches 406 and 408 are connected between the supply terminals 270 and 272 of the amplifier 260 and the supplies VCC and VEE respectively, whereas switches 410 and 412 are connected between the supply terminals 294 and 296 of the amplifier 264 and the supplies VCC and VEE respectively. Although not illustrated explicitly, the switches 402, 404, 406, 408, 410 and 412 are preferably embodied by high speed switching transistors.

The amplifier 400 operates as described above with the switches 402 and 404 open and the switches 406, 408, 410 and 412 closed. Simultaneously changing the switch states:

1) disables the amplifier 400 via the switches 406, 408, 410 and 412;

2) maintains a near virtual ground at the terminals 256 and 258 via the switches 402 and 404 respectively; and 3) since the transconductance amplifiers 262 and 264 are disabled via the switches 406, 408, 410 and 412, the charge left in the integrating compensation capacitors 284 and 308 remains and thus Vout+ and Vout− remain relatively fixed.

Figure 9:
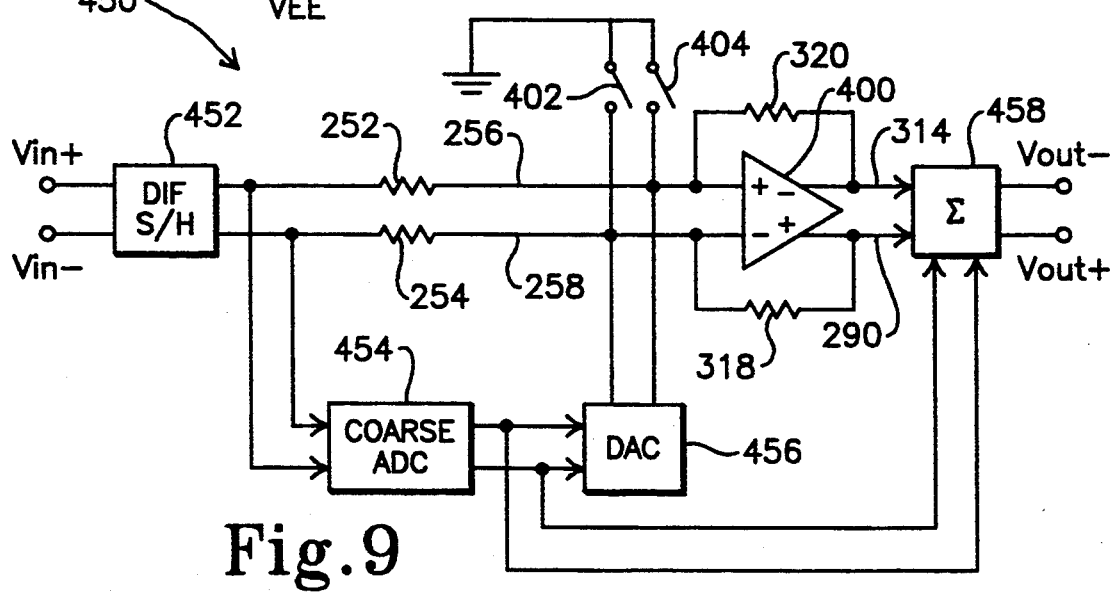
FIG. 9 is an electrical block diagram illustrating a sub-ranging analog-to-digital converter (ADC) including the amplifier of FIG. 8.

FIG. 9 illustrates a subranging ADC 450 which utilizes the amplifier 400, which is designated by a single symbol. Differential analog inputs Vin+ and Vin− are applied to a differential sample and hold (S/H) circuit 452, the outputs of which are applied through the resistors 252 and 254 to the voltage input terminals 256 and 258 of the amplifier 400. The outputs of the circuit 452 are also applied through a coarse ADC 454 and a digital-to-analog converter (DAC) 456 directly to the input terminals 256 and 258.

The output currents of the S/H circuit 452 and the DAC 456 are subtractively summed at the input terminals 256 and 258. The output of the S/H circuit 452 represents the entire input signal Vin+/Vin−, whereas the output of the DAC 456 represents a coarse approximation thereof which is obtained, for example, by truncation. The difference between the outputs of the circuit 452 and DAC 456 is the difference between the original input signal and the coarse approximation, or the subrange. The subrange signals are amplified by the amplifier 400 and applied to a logic unit 458 which converts the subrange signals to digital form and combines them with the coarse digital signals from the ADC 454 to reconstruct the input signal in digital form.

The subranging function enables the ADC 450 to have a relatively fine resolution while utilizing ADCs with relatively small numbers of bits. This reduces the cost of the ADC 450. However, in various applications only relatively low amplitude portions of the input signal (which are known in advance) contain useful information. If non-useful high amplitude portions of the input signal were applied to the amplifier 400, they would overdrive the voltage inputs or at least produce large transient currents in the amplifier 400 if the switches 402 and 404 (and optionally the switches 406, 408, 410 and 412 which are not shown in FIG. 9) were not provided.

For this reason, the switches 402 and 404 are closed in a predetermined manner, such as by clock pulses which are synchronized with the input signal, while the input signal amplitude is known to exceed a predetermined level.

While several illustrative embodiments of the invention have been shown and described, numerous variations and alternate embodiments will occur to those skilled in the art, without departing from the spirit and scope of the invention.

For example, although the amplifiers of the present invention have been described and illustrated as being embodied using bipolar transistors, they may alternatively be embodied by field-effect or other types of transistors which provide the required functions.

Accordingly, it is intended that the present invention not be limited solely to the specifically described illustrative embodiments. Various modifications are contemplated and can be made without departing from the spirit and scope of the invention as defined by the appended claims.

We claim:

1. A differential amplifier, comprising:

first and second current feedback amplifier means, operable to produce first and second current outputs, said first and said second current outputs being summed together within a feedback loop, each including:

a high impedance voltage input for receiving a differential input signal;

a low impedance current input; and a voltage output for producing an output signal said voltage output operable to be fed back into the voltage input of said second feedback amplifier means thereby producing the feedback loop, said voltage output produced from the summation of said first and said second current outputs of said first and said second current feedback amplifier means; and resistance means interconnecting said current inputs of the first and second current feedback amplifier means.

* * * * *